(12) United States Patent
Becker et al.

(10) Patent No.: US 12,046,576 B2
(45) Date of Patent: Jul. 23, 2024

(54) PRESSURE SINTERING DEVICE AND METHOD FOR MANUFACTURING AN ELECTRONIC COMPONENT

(71) Applicant: DANFOSS SILICON POWER GMBH, Flensburg (DE)

(72) Inventors: Martin Becker, Nordborg (DK); Dirk Dittmann, Nordborg (DK)

(73) Assignee: DANFOSS SILICON POWER GMBH, Flensburg (DE)

( * ) Notice: Subject to any disclaimer, the term of this patent is extended or adjusted under 35 U.S.C. 154(b) by 349 days.

(21) Appl. No.: 17/435,752

(22) PCT Filed: Feb. 27, 2020

(86) PCT No.: PCT/EP2020/055181
§ 371 (c)(1),
(2) Date: Sep. 2, 2021

(87) PCT Pub. No.: WO2020/178143
PCT Pub. Date: Sep. 10, 2020

(65) Prior Publication Data
US 2022/0157773 A1    May 19, 2022

(30) Foreign Application Priority Data
Mar. 4, 2019    (DE) .................. 102019105465.6

(51) Int. Cl.
*H01L 23/00* (2006.01)
*H01L 25/07* (2006.01)
(Continued)

(52) U.S. Cl.
CPC .............. *H01L 24/95* (2013.01); *H01L 24/75* (2013.01); *H01L 24/83* (2013.01); *H05K 3/32* (2013.01);
(Continued)

(58) Field of Classification Search
CPC .................. B29C 67/04; B29C 43/006; B29C 2043/3233; B29C 43/305;
(Continued)

(56) References Cited

U.S. PATENT DOCUMENTS

2014/0256087 A1    9/2014    Liu et al.

FOREIGN PATENT DOCUMENTS

| DE | 102010020696 A1 | 11/2011 |
| DE | 2804209 | * 5/2013 |
| WO | 2016159070 A1 | 10/2016 |

OTHER PUBLICATIONS

International Search Report for PCT Serial No. PCT/EP2020/055181 dated Jul. 30, 2020.

* cited by examiner

*Primary Examiner* — Stella K Yi
(74) *Attorney, Agent, or Firm* — McCormick, Paulding & Huber PLLC

(57) ABSTRACT

A method for manufacturing an electronic component by a pressure-assisted low-temperature sintering process, by using a pressure sintering device having an upper die and a lower die is disclosed. The upper the die and/or the lower die is provided with a first pressure pad, wherein the method includes the following steps: placing a first sinterable component on a first sintering layer provided on a top layer of a first substrate; joining the sinterable component and the top layer of the first substrate to form a first electronic component by pressing the upper die and the lower die towards each other, wherein the sintering device is simultaneously heated.

23 Claims, 7 Drawing Sheets

(51) Int. Cl.
*H05K 1/18* (2006.01)
*H05K 3/32* (2006.01)

(52) U.S. Cl.
CPC ............ *H01L 24/29* (2013.01); *H01L 25/071* (2013.01); *H01L 25/072* (2013.01); *H01L 2224/2929* (2013.01); *H01L 2224/29339* (2013.01); *H01L 2224/75265* (2013.01); *H01L 2224/75315* (2013.01); *H01L 2224/7598* (2013.01); *H01L 2224/75984* (2013.01); *H01L 2224/83001* (2013.01); *H01L 2224/83203* (2013.01); *H01L 2224/83222* (2013.01); *H01L 2224/8384* (2013.01); *H01L 2224/95001* (2013.01); *H05K 1/18* (2013.01); *H05K 2201/10015* (2013.01); *H05K 2201/10022* (2013.01); *H05K 2201/1003* (2013.01); *H05K 2201/10166* (2013.01); *H05K 2201/10287* (2013.01); *H05K 2203/0182* (2013.01); *H05K 2203/0191* (2013.01); *H05K 2203/1131* (2013.01); *H05K 2203/1509* (2013.01); *H05K 2203/1536* (2013.01)

(58) Field of Classification Search
CPC ............ B29C 2043/3205; B29C 43/28; B29C 43/206; B29C 43/203
See application file for complete search history.

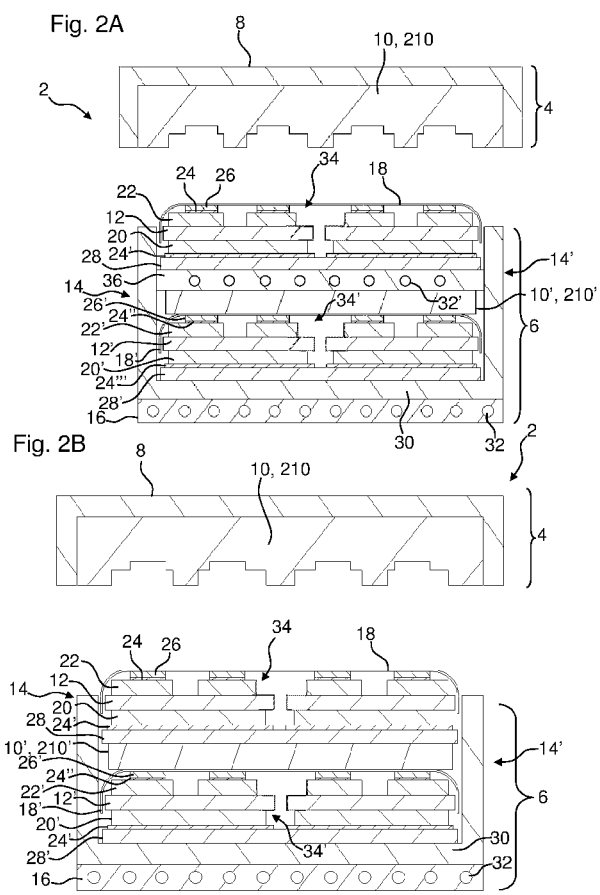

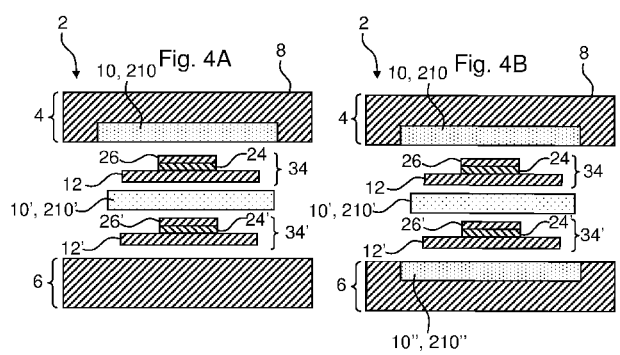
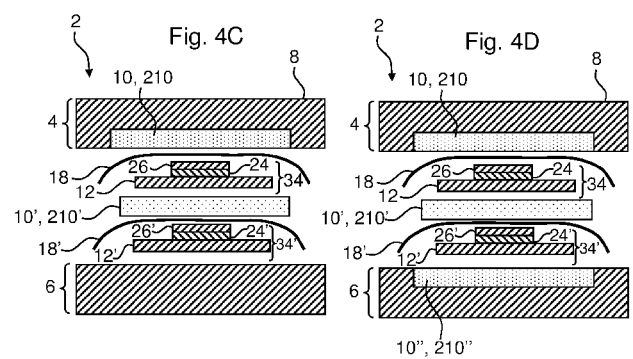

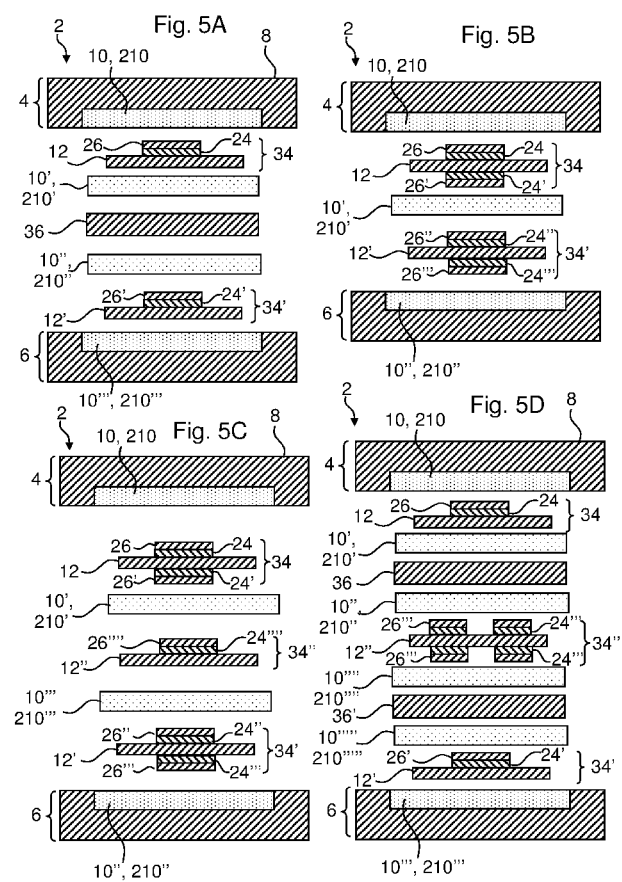

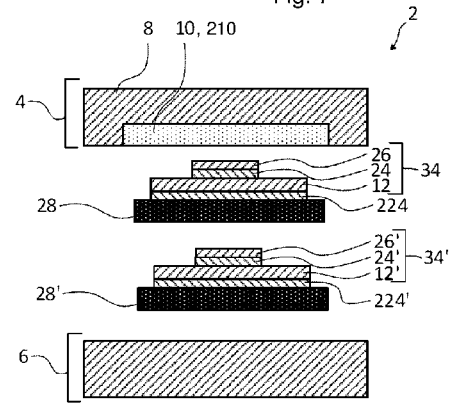
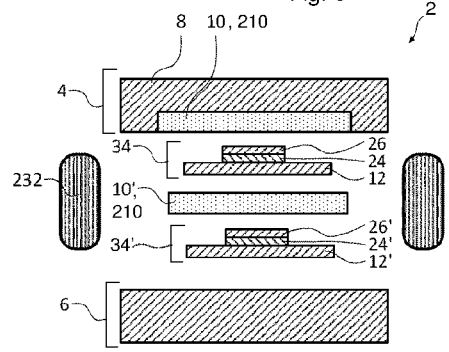

PRESSURE SINTERING DEVICE AND METHOD FOR MANUFACTURING AN ELECTRONIC COMPONENT

CROSS-REFERENCE TO RELATED APPLICATIONS

This application is a National Stage application of International Patent Application No. PCT/EP2020/055181, filed on Feb. 27 2020, which claims priority to German Application No. 102019105465.6 filed on Mar. 4, 2019, each of which is hereby incorporated by reference in its entirety.

TECHNICAL FIELD

The present invention relates to a method for manufacturing an electronic component by a pressure-assisted low-temperature sintering process, by using a pressure sintering device. The present invention also relates to a pressure sintering device for manufacturing an electronic component via a pressure-assisted low-temperature sintering process.

BACKGROUND

It is known that pressure-assisted low-temperature sintering of silver paste can be used as an alternative to solder reflow as a die-attachment solution. By using a quasi-hydrostatic pressure, it is possible to lower the sintering temperature. The popularity of this technology has been increasing due to the fact that the technology is applicable also for high temperature packages.

As the prior art has several limitations with respect to the production capacity, it would be desirable to be able to provide an alternative method for manufacturing an electronic component by using a pressure-assisted low-temperature sintering process, wherein the method allows for increasing the production capacity. Likewise, it would be desirable to be able to provide an alternative pressure sintering device for manufacturing an electronic component via a pressure-assisted low-temperature sintering process, wherein the pressure sintering device has an increased production capacity.

SUMMARY

The method according to the invention is a method for manufacturing an electronic component by a pressure-assisted low-temperature sintering process, by using a pressure sintering device having an upper die and a lower die, wherein the upper the die and/or the lower die is provided with a first pressure pad, wherein the method comprises the following steps:
  placing a first sinterable component on a first sintering layer provided on a top layer of a first substrate;
  joining the sinterable component and the top layer of the first substrate to form a first electronic component by pressing the upper die and the lower die towards each other, wherein the sintering device is simultaneously heated,
wherein the method applies the following steps before the upper die and the lower die are pressed towards each other:
  placing, in a level above the first electronic component or below the first electronic component, at least a second sinterable component on a second sintering layer provided on a top layer of a second substrate;
  placing a second pressure pad between the first electronic component and a second electronic component comprising the second sinterable component arranged on the second sintering layer provided on the top layer of the second substrate.

Hereby, the method makes it possible to increase production capacity. The production capacity can be increased by stacking electronic components in such a manner that they are arranged in several levels (layers). Such electronic components may comprise a substrate (such as a direct copper bonded (DCB) substrate) on which are placed individual components such as semiconductors (for example IGBT's, MOSFETs or equivalent), passive components such as resistors, capacitors or inductors, and connecting components such as wire bonds.

The method is a method for manufacturing an electronic component by a pressure-assisted low-temperature sintering process.

The method is carried out by using a pressure sintering device having an upper die and a lower die, wherein the upper the die and/or the lower die is provided with a first pressure pad By placing a first sinterable component on a first sintering layer provided on a top layer of a first substrate and joining the sinterable component and the top layer of the first substrate to form a first electronic component upon pressing the upper die and the lower die towards each other, in a manner in which the sintering device is simultaneously heated, it is possible to arrange the structures of a first electronic component in the pressure sintering device.

The sintering layer may be any suitable type of sintering layer. The sintering layer material used is preferably silver (Ag) available in the form of a silver-comprising sintering paste. Such a paste may contain, in addition to finely-divided silver, several organic components which may act as a binder, a dispersant and a thinner Sintering layers comprising alloys of silver, or other metals, are also possible.

The effect of placing, in a level above the first electronic component or below the first electronic component, at least a second sinterable component on a second sintering layer provided on a top layer of a second substrate; placing a second pressure pad between the first electronic component and the second electronic component, before the upper die and the lower die are pressed towards each other is that several electronic components (substrates) are stacking in such a manner that they are arranged in several levels (layers). Accordingly, it possible to increase production capacity, since multiple layers of electronic components may be simultaneously sintered.

It may be an advantage that the method comprises the step of covering the first sinterable component with a first protective foil arranged to be brought into engagement with the first pressure pad. Hereby, the protective foil together with the pressure pad makes it possible to ensure that a uniform pressure distribution is provided over the entire substrate of the first electronic components. In addition, the protective foil separates the first sinterable component from the first pressure pad and protects the first sinterable component from contamination and adhesion, for example by material abrasion, in particular silicone abrasion of the pressure pad. An additional advantage to the use of a protective foil is found in embodiments where the pressure pad is essentially flat and hard and where the electronic components have surfaces to which the force is applied via the pressure pad which are not all on the same plane. Here small variations of 100 μm or less may be absorbed by the resilience found in the foil material. Suitable foils may comprise Polytetrafluoroethylene (PTFE) (such as Teflon™) or Perfluoroalkoxy alkane (PFA).

It may be advantageous that the method comprises the step of covering the second sinterable component with a second protective foil. Hereby, the protective foil together with the pressure pad makes it possible to ensure that a uniform pressure distribution is provided over the entire substrate of the second electronic components.

The use of a protective foil may also make it possible to better position the second electronic component on the first electronic component.

In one embodiment, the protective foil is made of a thermoplastic polymer. It may be an advantage that the protective foil has a low coefficient of friction, preferably below 0.2 such as 0.05-0.10.

In one embodiment, the sinterable component is a semiconductor. It may be an advantage that the method applies the step of attaching the substrate to a base plate. Hereby, it is possible to build a component having one or more structures sintered to the base plate.

In one embodiment, one or more of the pressure pads are deformable pressure pads comprising material which is soft and will tend to enclose the components placed on the substrate and thus transmit the pressure applied between the upper die and the lower die in all directions to the adjacent objects, rather than uniaxially. Thus, pressure is applied hydrostatically, and the process may also be referred to as a quasi-hydrostatic pressure sintering process. In such an embodiment, method is carried out by using a pressure sintering device having an upper die and a lower die, wherein the upper the die and/or the lower die is provided with a first deformable pressure pad. The use of a deformable pressure pad makes it possible to evenly distribute the pressure towards electronic components having one or more structures protruding from the remaining part of the electronic component.

It may be advantageous that the deformable pressure pads are at least partly made of silicone.

In one embodiment, the deformable pressure pads comprise a fluid contained in an enclosure. Hereby, deformable pressure pads are capable of evenly distributing the pressure towards the underlying electronic components. This is in particular important in configurations, in which the electronic components comprise one or more structures that protrude from the remaining part of the electronic component.

In one embodiment, the thickness of the deformable pressure pads is in the range 300 μm-3 mm.

In one embodiment, the thickness of the deformable pressure pads is in the range 1-2 mm.

In one embodiment, the thickness of the protective foils is in the range 1-500 μm.

In one embodiment, the thickness of the protective foils is in the range 50-500 μm.

In one embodiment, the protective foil is made of polytetrafluoroethylene (PTFE) or perfluoroalkoxy (PFA).

The pressure pads should be flexible and thus allow the pressure pads to deform hereby adapting to the geometry of the structures abutting the pressure pads.

It may be advantageous that a plate is arranged between adjacent electronic components.

In one embodiment, the plate has a planar geometry.

In one embodiment, the plate has a uniform thickness.

It may be advantageous that the heating is provided by using one or more heating elements integrated in the upper die and/or the lower die.

In one embodiment, the heating elements are provided as tubes.

In one embodiment, the heating is provided by using one or more electronic heating elements. These electronic heating elements may be integrated in the upper die and/or the lower die.

In one embodiment, the heating elements are provided as one or more heating wires or cables.

In one embodiment, the heating is provided by using one or more fluid-based heating elements. These heating elements may be integrated in the upper die and/or the lower die. The heating elements may be liquid-based.

In one embodiment, heating is provided by using one or more heating elements integrated in the plate. This may be advantageous since the plate normally will be arranged in a position, in which the plate is capable of distributing heat to the centrally arranged structures.

In one embodiment, the plate is heated by induction means. In this embodiment, a means of generating suitable inductive fields is placed adjacent to the device used for pressure sintering and the plate at least partially comprises a material capable of being heated inductively.

In one embodiment, the first electronic component or the second electronic component comprises a baseplate which functions as the additional pressure pad. By use of a baseplate to take the place of the additional pressure pad, a separate additional pressure pad is not required, and the inventive method is simpler and easier to achieve than prior art methods.

The pressure sintering device according to the invention is a pressure sintering device for manufacturing an electronic component via a pressure-assisted low-temperature sintering process, wherein the pressure sintering device comprises:

an upper die and a lower die arranged to be moved relative to each other, wherein upper the die and/or the lower die is provided with a first pressure pad, wherein the pressure sintering device is configured to heat and provide a pressurise an electronic component arranged between the upper die and a lower die, wherein the pressure sintering device comprises at least one additional pressure pad being arranged to separate a first electronic component from and a second electronic component when the first electronic component and the second electronic component are arranged between the the upper die and a lower die.

The pressure sintering device makes it possible to increase the production capacity by stacking electronic components (substrates) in such a manner that they are arranged in several levels (layers).

In one embodiment, one or more of the pressure pads is a deformable pressure pad comprising material which is soft and will tend to enclose the components placed on the substrate and thus transmit the pressure applied between the upper die and the lower die in all directions to the adjacent objects, rather than uniaxially. Thus, pressure is applied hydrostatically, and the process may also be referred to as a quasi-hydrostatic pressure sintering process. In such an embodiment, method is carried out by using a pressure sintering device having an upper die and a lower die, wherein the upper the die and/or the lower die is provided with a first deformable pressure pad. The use of a deformable pressure pad makes it possible to evenly distribute the pressure towards electronic components having one or more structures protruding from the remaining part of the electronic component.

It may be an advantage that the upper die and/or the lower die is provided with a cavity configured to receive the first deformable pressure pad. Hereby, it is possible to integrate the first deformable pressure pad in the cavity and thus provide surface with which it is possible to transfer a pressure to underlying structures of electronic components in a manner, in which the pressure is being evenly distributed. Accordingly, damage due to too high peak forces can be avoided. Moreover, it is easier to carry out a pressure control allowing the sintering process to be carried out in the most optimum manner.

In one embodiment, the deformable pressure pads are at least partly made of silicone. Tests have revealed that deformable pressure pads made of silicone are suitable for being used.

It may be an advantage that the deformable pressure pads comprise a fluid contained in an enclosure. Hereby, the deformable pressure pads can evenly distribute the pressure from upper die towards the underlying structures.

It is preferred that the fluid is an incompressible fluid, preferably a liquid at room temperature.

In one embodiment, the thickness of the deformable pressure pads is in the range 300 μm-3 mm.

In a preferred embodiment, thickness of the deformable pressure pads is in the range 1-2 mm.

It may be advantageous that the pressure sintering device comprises one or more heating elements integrated in the upper die and/or lower die.

In one embodiment, the pressure sintering device comprises a plate configured to be arranged between adjacent electronic components.

It may be beneficial that one or more heating elements integrated in the plate.

In one embodiment, the plate is heated by induction means. In this embodiment, a means of generating suitable inductive fields is placed adjacent to the device used for pressure sintering and the plate at least partially comprises a material capable of being heated inductively.

In one embodiment, the first electronic component or the second electronic component comprises a baseplate which functions as the additional pressure pad. By use of a baseplate to take the place of the additional pressure pad, a separate additional pressure pad is not required, and the inventive pressure sintering device is simpler and easier to assemble and use than prior art devices.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings:

FIG. 2A shows another pressure sintering device according to the invention;

FIG. 2B shows a further pressure sintering device according to the invention;

FIG. 4A shows a schematic view of a pressure sintering device according to the invention;

FIG. 4B shows a schematic view of another pressure sintering device according to the invention;

FIG. 4C shows a schematic view of a pressure sintering device according to the invention;

FIG. 4D shows a schematic view of another pressure sintering device according to the invention FIG. 5A shows a pressure sintering device according to the invention comprising a plate;

FIG. 5B shows a pressure sintering device as the one shown in FIG. 5A, wherein the plate is removed;

FIG. 5C shows a pressure sintering device according to the invention;

FIG. 5D shows a pressure sintering device according to the invention comprising two plates;

FIG. 7 shows a pressure sintering device according to the invention utilizing base plates, and FIG. 8 shows a pressure sintering device according to the invention comprising an inductive heating means.

DETAILED DESCRIPTION

Figure 1A:
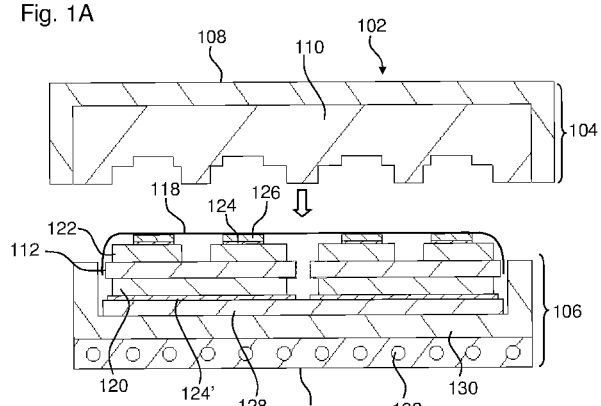
FIG. 1A shows a prior art pressure sintering device.
Figure 1B:
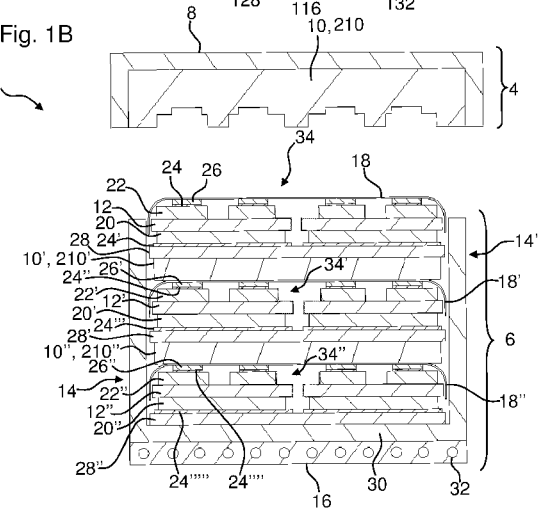
FIG. 1B shows a pressure sintering device according to the invention.

Referring now in detail to the drawings for the purpose of illustrating preferred embodiments of the present invention, a pressure sintering device 2 of the present invention is illustrated in FIG. 1B.

FIG. 1A illustrates a prior art pressure sintering device 2 comprising an upper die 104 comprising a top portion 108 provided with a pressure pad 110. The prior art pressure sintering device 102 also comprises a lower die 106 comprising a bottom portion 116 and an end portion 130 arranged on the top of the bottom portion 116, wherein a plurality of heating elements 132 are integrated in the bottom portion 116. The lower die 106. A base plate 128 is arranged on the end portion 130. Two electronic components are spaced apart and arranged next to each other on the base plate 128. Each of the electronic components comprises a sintering layer 124' placed on the top of the base plate 128. A lower conducting layer 120 is arranged on the top of the sintering layer 124'. An insulator 112 is arranged each on the top of the lower conducting layer 120. Two upper conducting layers 122 are placed on the insulator 112 and a sinterable component 126 is arranged on a sintering layer 124 provided on the top of each of the upper conducting layers 122.

It can be seen that the prior art pressure sintering device 102 has a limited production capacity due to the limited space available in the cavity of the lower die 106. The prior art pressure sintering device 102 only allows for production of a single "layer of electronic components".

FIG. 1B illustrates an embodiment of a pressure sintering device 2 according to the invention. The pressure sintering device 2 comprises an upper die 4 comprising a top portion 8 provided with a pressure pad 10, 210. The pressure sintering device 2 also comprises a lower die 6 comprising a bottom portion 16 and an end portion 30 arranged on the top of the bottom portion 16. A plurality of heating elements 32 are integrated in the bottom portion 16. The lower die 6 also comprises side portions 14, 14' extending from the end portion 30. The end portion 30 and the side portions 14, 14' define a cavity, in which a plurality of components are arranged.

In the bottom end of the cavity a base plate 28" is arranged. Two electronic components 34" are arranged on the base plate 28'. Each electronic component 34" comprises a sintering layer 24"" that is placed on the top of the base plate 28". In each electronic component 34" a lower conducting layer 20" is arranged on the top of the sintering layer 24"". An insulator 12" is arranged each on the top of the lower conducting layer 20". Furthermore, two upper conducting layers 22" are placed on the insulator 12".

The structure of the lower conducting layer 20", the insulator 12" and the upper conducting layers 22" can with advantage be supplied by a direct copper bonded (DCB) substrate. Such a substrate is well known, and comprises a lower conducting layer, an upper conducting layer and an insulating layer. The insulating layer is provided in between the upper and lower conducting layers. The insulating layer electrically isolates the upper and lower conducting layers. By way of example, the conducting layers may be copper layers, although alternatives (such as aluminium) are possible. The insulating layer may be a ceramic layer. Possible materials for the insulating layer include alumina (Al2O3), aluminium nitride (AlN) and beryllium oxide (BeO). The skilled person will be aware of many alternative materials that could be used. A circuit structure may be created in the upper copper layer and may be populated with semiconductor switches, capacitors and/or resistors as required to form a functioning circuit.

In each electronic component 34" a sinterable component 26" is placed on a sintering layer 24"''' provided on the top of each of the upper conducting layers 22". A protective foil 18" covers the sinterable components 26". A pressure pad 10", 210" is brought into engagement with the protective foil 18" in such a manner that the protective foil 18" is sandwiched between the sinterable components 26" and the pressure pad 10", 210". A portion of the protective foil 18" extends along the entire height of the upper conducting layer 22" and the insulator 12".

A base plate 28' is arranged on the top of the pressure pad 10", 210". Two electronic components 34' are arranged on the base plate 28', wherein each electronic component 34' comprises the same structures as the electronic components 34" arranged below the protective foil 18".

Accordingly, each electronic component 34' comprises a sintering layer 24''' placed on the top of the base plate 28'. A lower conducting layer 20' is arranged on the top of the sintering layer 24''' and an insulator 12' is arranged on the top of the lower conducting layer 20'. Two upper conducting layers 22' are arranged on the insulator 12' and a sinterable component 26' is arranged on a sintering layer 24" provided on the top of each of the upper conducting layers 22'.

A protective foil 18' covers the sinterable components 26' and a pressure pad 10' is brought into engagement with the protective foil 18' in a manner, in which the protective foil 18' is sandwiched between the sinterable components 26' and a pressure pad 10', 210'. The protective foil 18' extends along the entire height of the upper conducting layer 22' and the insulator 12'. The protective foil 18' ensures that a uniform pressure distribution is provided over the entire array of sinterable components 26'. In addition, the protective foil separates the sinterable components 26' from the pressure pad 10', 210' and protects the sinterable components 26' from contamination and adhesion, for example by material abrasion.

A base plate 28 is arranged on the top of the pressure pad 10', 210'. Two electronic components 34 are placed on the base plate 28. Each electronic component 34 comprises the same structures as the electronic components 34" arranged below the protective foil 18" and the electronic components 34' arranged below the protective foil 18'. Thus, each electronic component 34 comprises a sintering layer 24' arranged on the top of the base plate 28. A lower conducting layer 20 is arranged on the top of the sintering layer 24' and an insulator 12 is arranged on the top of the lower conducting layer 20. Two upper conducting layers 22 are arranged on the insulator 12 whereas a sinterable component 26 is arranged on a sintering layer 24 provided on the top of each of the upper conducting layers 22.

A protective foil 18 covers the sinterable components 26. The protective foil 18 extends along the entire height of the upper conducting layer 22 and the insulator 12.

In FIG. 1B, the top portion 8 is illustrated in a configuration, in which the top portion 8 is arranged above the lower die 6. It can be seen that the pressure pad 10, 210 of the top portion 8 is shaped to fit to the geometry of the structures 22, 24, 26 protruding from the insulators 12 of the electronic components 34.

In an alternative embodiment, the shaping of the pressure pad 10, 210 of the top portion to fit the geometry of the structures 22, 24, 26 protruding from the insulators 12 of the electronic components 34 may be dispensed with, and the lower contour of the pressure pad 10, 210 may be left essentially flat. In this case, the force applied to the electronic components 34 will be applied to the highest points of those components. If there is very little difference in the heights of the components, for example if they are less than 50 μm or preferentially less than 20 μm, then an acceptable distribution of force results, and the pressure applied through the stack of electronic components 34, 34", 34''' between the upper die 4 and the lower die 6 (not shown in this figure) is essentially uniaxial.

The invention allows for manufacturing electronic components 34, 34', 34" by a pressure-assisted low-temperature sintering process, by using the pressure sintering device 2. The method according to the invention applies the step of placing a second pressure pad 10', 210' between a first electronic component 34 and the second electronic component 34' before the upper die 4 and the lower die 6 are pressed towards each other. Hereby, it is possible to carry out a sintering process that allows to be able to increase the capacity of the pressure sintering device 2.

FIG. 2A illustrates another embodiment of a pressure sintering device 2 according to the invention. The pressure sintering device 2 comprises an upper die 4 comprising a top portion 8 provided with a pressure pad 10, 210. The pressure sintering device 2 comprises a lower die 6 having a bottom portion 16 and an end portion 30 arranged on the top of the bottom portion 16. A plurality of heating elements 32 are integrated in the bottom portion 16. The lower die 6 comprises side portions 14, 14' extending from the end portion 30. The side portions 14, 14' and the end portion 30 define a cavity, in which a plurality of components are arranged.

A base plate 28' is arranged in the bottom end of the cavity. Two first electronic components 34' are arranged on the base plate 28'. Both electronic component 34' comprises a sintering layer 24''' placed on the top of the base plate 28'; a lower conducting layer 20' arranged on the sintering layer 24'''; an insulator 12' placed on the sintering layer 24'''; two spaced apart upper conducting layers 22' arranged on the insulator 12'; a sintering layer 24" arranged on the top of each upper conducting layers 22' and a sinterable component 26' arranged on the top of each sintering layer 24". A protective foil 18' is arranged to protect the sinterable components 26' and thus it covers the sinterable components 26'. The protective foil 18' is arranged in such a manner that parts of it extends along the entire height of the upper conducting layer 22' and the insulator 12'. In one embodiment, however, the protective foil 18' does not extend along the entire height of the upper conducting layer 22' and the insulator 12'.

A pressure pad 10', 210' is brought into engagement with the protective foil 18' in such a manner that the protective foil 18' is sandwiched between the sinterable components 26' and the pressure pad 10', 210'. A plate 36 provided with a plurality of heating element 32' are arranged on the top of the pressure pad 10', 210'. The plate 36 is capable of distributing the pressure (originating from the structures arrange above the plate 36) evenly onto the pressure pad 10', 210'. At the same time, the plate 36 is capable of heating up the surrounding structures.

A base plate 28 is arranged on the top of the plate 36 and two electronic components 34 are arranged on the base plate 28. Both electronic component 34 comprises a first sintering layer 24' placed on the top of the base plate 28; a lower conducting layer 20 arranged on the sintering layer 24'; an insulator 12 placed on the sintering layer 24'; two spaced apart upper conducting layers 22 arranged on the insulator 12; a second sintering layer 24 arranged on the top of each upper conducting layers 22 and a sinterable component 26 arranged on the top of each sintering layer 24. Furthermore, a protective foil 18 is covers the sinterable components 26. The protective foil 18' is arranged in a configuration in which parts of it extends along the entire height of the upper conducting layer 22 and the insulator 12.

The pressure pad 10, 210 of the upper die 4 is formed to fit to the geometry of the structures 22, 24, 26 protruding from the insulator 12.

FIG. 2B illustrates a pressure sintering device 2 corresponding to the one shown in FIG. 2A. The side portions 14, 14' and the end portion 30 define a cavity configured to house a plurality of components. Whereas in FIG. 2A, a plate 36 is provided between the uppermost base plate 28 and the pressure pad 10', 210', in FIG. 2B, however, the plate 36 has been removed.

Figure 3:
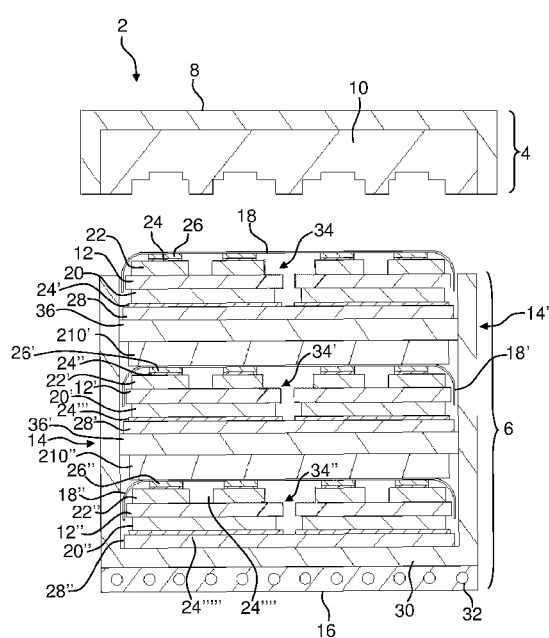
FIG. 3 shows a further pressure sintering device according to the invention.

FIG. 3 illustrates a pressure sintering device 2 corresponding to the one shown in FIG. 1B, but illustrates the use of deformable pressure pads 210', 210". The side portions 14, 14' and the end portion 30 define a cavity, in which several components are arranged. In FIG. 3, however, a first plate 36 is provided between the uppermost base plate 28 and the deformable pressure pad 210' and a second plate 36' is provided between the uppermost base plate 28' and the deformable pressure pad 210". Even though, it is not illustrated in FIG. 3, heating elements may be provided in the plates 36, 36'.

FIG. 4A illustrates a schematic view of a pressure sintering device 2 according to the invention. The method according to the invention can be carried out by using such pressure sintering device 2. The pressure sintering device 2 comprises an upper die 4 provided with a top portion 8 comprising a pressure pad 10, 210 that is integrated in a cavity of the top portion 8. The pressure sintering device 2 comprises a lower die 6 configured to be pressed towards the upper die 4 in order to carry out the pressure-assisted low-temperature sintering process according to the invention.

A first electronic component 34 and a second electronic component 34' are arranged between the upper die 4 and the lower die 6. Furthermore, a pressure pad 10', 210' is arranged between the electronic components 34, 34'. Accordingly, the pressure sintering device 2 can be used to manufacture electronic components 34, 34' arranged in a stacked configuration (arranged in different layers e.g. being vertically displaced from each other). Each electronic component 34, 34' comprises a sinterable component 26, 26' arranged on a sintering layer 24, 27 provided on an insulator 12, 12'. Such sinterable components may comprise semiconductors, (for example IGBT's, MOSFETs or equivalent), passive components such as resistors, capacitors or inductors, and connecting components such as wire bonds.

FIG. 4C illustrates a pressure sintering device 2 corresponding to the one shown in FIG. 4A. Furthermore, the same components are arranged between the upper die 4 and the lower die 6 as shown in FIG. 4A. In FIG. 4C, however, a first protective foil 18 is provided between the sinterable component 26 of the first electronic component 34 and the of the pressure pad 10 of the upper die 4. Moreover, a second protective foil 18' is arranged between the sinterable component 26' of the first electronic component 34 and the of the pressure pad 10'.

FIG. 4B illustrates a pressure sintering device 2 that almost corresponds to the one shown in FIG. 4A. The lower die 6, however, comprises a pressure pad 10", 210".

FIG. 4D illustrates a pressure sintering device 2 that almost corresponds to the one shown in FIG. 4C. The lower die 6, however, comprises a pressure pad 10", 210".

FIG. 5A illustrates a pressure sintering device 2 according to the invention. The pressure sintering device 2 corresponds to the one shown in FIG. 4B. In FIG. 5A, the same components are arranged between the upper die 4 and the lower die 6 as shown in FIG. 4B. In FIG. 5A, however, a plate 36 and an additional pressure pad 10" are arranged between the pressure pad 10', 210' and the second electronic component 34'. Accordingly, plate 36 mechanically isolates the two electronic components 34, 34'.

FIG. 5B illustrates a pressure sintering device 2 according to the invention. The pressure sintering device 2 corresponds to the one shown in FIG. 4B. In FIG. 5A, however, a first double sided electronic component 34 and a second double sided electronic component 34' are arranged between the upper die 4 and the lower die 6. A pressure pad 10, 210 is arranged between the electronic component 34, 34'. The first double sided electronic component 34 comprises an insulation 12 having a top surface provided with a first sintering layer 24 onto which a first sinterable component 26 is placed. The underside surface is provided with a second sintering layer 24' onto which a second sinterable component 26' is arranged.

Likewise, the second double sided electronic component 34' comprises an insulation 12' having a top surface provided with a first sintering layer 24" onto which a first sinterable component 26" is placed. The underside surface is provided with a second sintering layer 24"" onto which a second sinterable component 26'" is arranged.

FIG. 5C illustrates a pressure sintering device 2 according to the invention. The pressure sintering device 2 corresponds to the one shown in FIG. 5B. In FIG. 5C, however, an additional single sided electronic component 34" is arranged between the pressure pad 10', 210' and the second double sided electronic component 34'. Furthermore, an additional pressure pad 10'" is arranged between the additional single sided electronic component 34" and the second double sided electronic component 34'.

FIG. 5D illustrates a pressure sintering device 2 according to the invention. The pressure sintering device 2 corresponds to the one shown in FIG. 5A. In FIG. 5D, however, an additional double sided electronic component 34" is arranged between the pressure pad 10", 210" and the second single sided electronic component 34'. Furthermore, an additional pressure pad 10"", 210"", a plate 36' and a further pressure pad 10""', 210""' are (in that order) arranged between the additional double sided electronic component 34" and the second single sided electronic component 34'.

FIG. 5A, FIG. 5B, FIG. 5C and FIG. 5D illustrate that the method according to the invention allows for manufacturing both single sided electronic component and double sided electronic component and that the electronic components may be arranged in various configurations relative to each other. It can be seen that the method makes it possible to manufacture more than two layers of electronic component.

Figure 6:
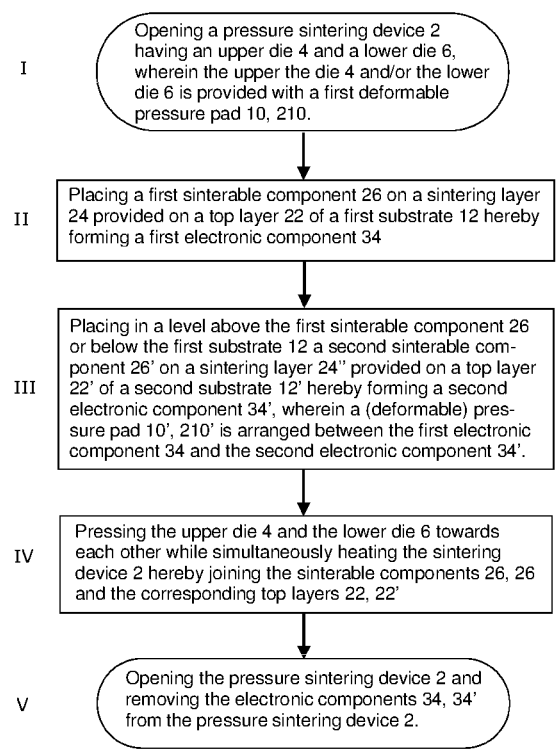
FIG. 6 shows a flowchart illustrating the steps of the method according to the invention.

FIG. 6 is a flowchart illustrating the steps of the method according to the invention. The reference numbers used corresponds to the one used with reference to FIG. 1-5. The first step I comprises: opening a pressure sintering device 2 having an upper die 4 and a lower die 6, wherein the upper the die 4 and/or the lower die 6 is provided with a first pressure pad 10. In an alternative embodiment, this may be a deformable pressure pad 210. In this step, the pressure sintering device 2 is basically opened in order to allow the structures to be joint by using the pressure-assisted low-temperature sintering process according to the invention to arranged in the pressure sintering device 2.

The second step II comprises: placing a first sinterable component 26 on a sintering layer 24 provided on a top layer 22 of a first substrate 12 hereby forming a first electronic component 34. In this step, the structures forming the first electronic component 34 are positioned in the pressure sintering device 2.

The third step III comprises: placing in a level above the first sinterable component 26 or below the first substrate 12 a second sinterable component 26' on a sintering layer 24" provided on a top layer 22' of a second substrate 12' hereby forming a second electronic component 34', wherein a pressure pad 10', 210' is arranged between the first electronic component 34 and the second electronic component 34'. In this step, the structures forming the second electronic component 34' are positioned in the pressure sintering device 2.

The fourth step IV comprises: pressing the upper die 4 and the lower die 6 towards each other while simultaneously heating the sintering device 2 hereby joining the sinterable components 26, 26 and the corresponding top layers 22, 22'. In this step, the sintering device 2 is used to perform the pressure-assisted sintering process.

The fifth step V comprises: opening the pressure sintering device 2 and removing the electronic components 34, 34' from the pressure sintering device 2. In this step, the sintering device 2 is basically opened and the electronic components 34, 34' are removed.

It is important to underline that the method allows for arranging additional structures in more than two levels (layers). Furthermore, in each level/layer it is possible to manufacture several spaced apart electronic components like illustrated in FIG. 1B.

FIG. 7 illustrates a schematic view of a pressure sintering device 2 according to the invention. The method according to the invention can be carried out by using such pressure sintering device 2. The pressure sintering device 2 comprises an upper die 4 provided with a top portion 8 comprising a pressure pad 10, 210 that is integrated in a cavity of the top portion 8.

The pressure sintering device 2 comprises a lower die 6 configured to be pressed towards the upper die 4 in order to carry out the pressure-assisted low-temperature sintering process according to the invention.

A first electronic component 34 and a second electronic component 34' are arranged between the upper die 4 and the lower die 6. Furthermore, each electronic component 34, 34' comprises a sinterable component 26, 26' arranged on a sintering layer 24, 27 provided on an insulator 12, 12'. Such sinterable components may comprise semiconductors, (for example IGBT's, MOSFETs or equivalent), passive components such as resistors, capacitors or inductors, and connecting components such as wire bonds. The insulator 12, 12' is in turn arranged on a further sintering layer 224, 224' provided on a base plate 28, 28'. The base plates 28, 28' provide the utility of the pressure pad 10', 10", 10'", 10"", 210, 210", 210", 210"" used in other embodiments shown here since they conduct the force applied between the upper die and the low die through the components that are to be sintered. Accordingly, the pressure sintering device 2 can be used to manufacture electronic components 34, 34' arranged in a stacked configuration (arranged in different layers e.g. being vertically displaced from each other).

FIG. 8 illustrates a schematic view of a pressure sintering device 2 according to the invention. The method according to the invention can be carried out by using such pressure sintering device 2. The pressure sintering device 2 comprises an upper die 4 provided with a top portion 8 comprising a pressure pad 10, 210 that is integrated in a cavity of the top portion 8.

The pressure sintering device 2 comprises a lower die 6 configured to be pressed towards the upper die 4 in order to carry out the pressure-assisted low-temperature sintering process according to the invention.

A first electronic component 34 and a second electronic component 34' are arranged between the upper die 4 and the lower die 6. Furthermore, a pressure pad 10', 210' is arranged between the electronic components 34, 34'. The pressure pad 10', 210' in this embodiment comprises at least partially a ferromagnetic material which is suitable for heating by inductive heating processes. Also shown in this figure is an inductive heating means 232, such as an electrical coil (here shown in cross section), which surrounds the pressure sintering device during the sintering operation. The heat generated by the application of inductive heating is within the pressure pad 10', 210', and is therefore a great advantage to heat the sinter layer 24. Accordingly, the pressure sintering device 2 can be used to manufacture electronic components 34, 34' arranged in a stacked configuration (arranged in different layers e.g. being vertically displaced from each other).

The pressure pad 10 referred to in the figures may in some embodiments comprise a deformable pressure pad 210. Likewise, the additional pressure pad 10' may in some embodiments comprise a deformable pressure pad 210'. In a similar manner, the additional pressure pads 10", 10'", 10"", 10'"" may in some embodiments comprise a deformable pressure pad 210", 210'", 210"", 210'"".

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for manufacturing an electronic component by a pressure-assisted low-temperature sintering process, by using a pressure sintering device having an upper die and a lower die, wherein the upper die and/or the lower die is provided with a first pressure pad, wherein the method comprises the following steps:
    placing a first sinterable component on a first sintering layer provided on a top layer of a first substrate to provide a first formable electronic component;
    joining the first sinterable component and the top layer of the first substrate to form a first electronic component by pressing the upper die and the lower die towards each other, wherein the pressure sintering device is simultaneously heated;

wherein that the method applies the following steps before the upper die and the lower die are pressed towards each other:
placing, in a level above the first formable electronic component or below the first formable electronic component, a second formable electronic component comprising at least a second sinterable component on a second sintering layer provided on a top layer of a second substrate;
placing a second pressure pad between the first formable electronic component and the second formable electronic component.

2. The method according to claim 1, wherein the method comprises the step of covering the first sinterable component with a first protective foil arranged to be brought into engagement with the first pressure pad.

3. The method according to claim 1, wherein the method comprises the step of covering the second sinterable component with a protective foil.

4. The method according to claim 1, wherein the method applies the step of attaching the first or second substrate to a base plate.

5. The method according to claim 1, wherein one or more of the first and second pressure pads are deformable pressure pads.

6. The method according to claim 5, wherein the deformable pressure pads comprise a fluid contained in an enclosure.

7. The method according to claim 5, wherein the thickness of the deformable pressure pads is in the range 300 µm-3 mm.

8. The method according to claim 2, wherein the method comprises the step of covering the second sinterable component with a second protective foil.

9. The method according to claim 1, wherein a plate is arranged between adjacent electronic components.

10. The method according to claim 9, wherein the plate is heated by induction means.

11. The method according to claim 1, wherein the first electronic component or the second electronic component comprises a baseplate which functions as an additional pressure pad.

12. A pressure sintering device for manufacturing an electronic component via a pressure-assisted low-temperature sintering process, wherein the pressure sintering device comprises:
an upper die and a lower die arranged to be moved relative to each other, wherein upper die and/or the lower die is provided with a first pressure pad, wherein the pressure sintering device is configured to heat and pressurise an electronic component arranged between the upper die and a lower die, wherein the pressure sintering device comprises at least one additional pressure pad being arranged to separate a first electronic component from a second electronic component when the first electronic component and the second electronic component are arranged between the upper die and a lower die.

13. The pressure sintering device according to claim 12, wherein the first pressure pad and/or the at least one additional pressure pad is a deformable pressure pad.

14. The pressure sintering device according to claim 13, wherein the deformable pressure pads comprise a fluid contained in an enclosure.

15. The pressure sintering device according to claim 12, wherein the pressure sintering device comprises a plate configured to be arranged between adjacent electronic components.

16. The pressure sintering device according to claim 15, wherein one or more heating elements integrated in the plate.

17. The pressure sintering device according to claim 15, wherein the plate is heated by induction means.

18. The pressure sintering device according to claim 12, the first electronic component or the second electronic component comprises a baseplate which functions as the at least one additional pressure pad.

19. The method according to claim 8, wherein the thickness of the protective foils is in the range 1-500 µm.

20. The method according to claim 6, wherein the thickness of the deformable pressure pads is in the range 300 µm-3 mm.

21. The method according to claim 5, wherein the thickness of the deformable pressure pads is in the range 1-2 mm.

22. The method according to claim 8, wherein the thickness of the protective foils is in the range 50-500 µm.

23. The method according to claim 6, wherein the thickness of the deformable pressure pads is in the range 1-2 mm.

* * * * *